United States Patent [19]
Cheek, Jr.

[11] 3,953,837
[45] Apr. 27, 1976

[54] DUAL SERIAL-PARALLEL-SERIAL ANALOG MEMORY

[75] Inventor: Tom F. Cheek, Jr., Dallas, Tex.

[73] Assignee: Texas Instruments Incorporated, Dallas, Tex.

[22] Filed: Nov. 27, 1974

[21] Appl. No.: 527,670

[52] U.S. Cl. .................. 340/173 R; 307/221 C; 307/222 C; 307/238; 340/174 SR
[51] Int. Cl.² ............................. G11C 11/40
[58] Field of Search ... 340/173 R, 173 SM, 174 SR; 307/221 C, 222, 238

[56] References Cited
UNITED STATES PATENTS

| | | | |
|---|---|---|---|
| 3,643,106 | 2/1972 | Berwin | 340/173 R |
| 3,763,480 | 10/1973 | Weimer | 340/173 R |
| 3,797,002 | 3/1974 | Brown | 340/174 SR |

Primary Examiner—Terrell W. Fears
Attorney, Agent, or Firm—Hal Levine; James T. Comfort; Richard L. Donaldson

[57] ABSTRACT

A CCD shift register involves a serial input channel and a serial output channel interconnected by a plurality of parallel channels formed in a semiconductor body with separate arrays of multi electrode sets of phase electrodes overlying the input, parallel and output channels. A summing gate electrode common to all of the parallel channels is adjacent the output channel. Control means actuates the gate to transfer charge packets from each parallel channel into the output channel and clocks the charge packets to the output. Two such shift registers are provided with means to inject time samples of an input signal alternately to the two shift registers and to multiplex the outputs therefrom.

14 Claims, 7 Drawing Figures

DUAL SERIAL-PARALLEL-SERIAL ANALOG MEMORY

This invention relates to a charge coupled device (CCD) in which dispersion and cross talk in analog signals passing therethrough are minimized. In a more specific aspect, charge transfer efficiency is employed as a guide with isolation of charges in CCD serial-parallel-serial analog memory units.

Charge coupled devices in general are well-known. A generalized description thereof is found in "Electronics", June 21, 1971, pages 50 et seq. Details as to construction and operation of a charge coupled device is described in U.S. patent application Ser. No. 365,294, filed May 29, 1973, now U.S. Pat. No. 3,808,435.

a CCD multiplexer is described and claimed in U.S. patent application Ser. No. 398,285, filed 9/17/73, now U.S. Pat. No. 3,947,698.

It is highly desirable to be able to sample and store analog data with no intervening analog-to-digital-to-analog conversion. Sampling a signal at a first rate, storing the analog data and then shifting the data sequentially out of the device at a second rate by a simple clock controlled digital logic circuit has been found to be highly desirable. CCD's possess unique features which permit a new approach to implementation of analog data processing in an integrated circuit form.

The present invention provides the ability in a CCD to store charge packets representative of analog data samples from an input channel with subsequent shifting out of the device serially with no intervening analog-to-digital-to-analog conversion while minimizing dispersion and cross talk.

When surface channel charge coupled devices (CCD) are used as analog devices, charge transfer efficiency (CTE) becomes a critical parameter. Depending on the manner in which the CCD is used, poor CTE can cause dispersion and cross talk. In a serial-parallel-serial (S-P-S) analog memory, two effects can seriously degrade the performance. One degrading effect is due to the serial registers and the other is due to the parallel register.

In accordance with the present invention, a CCD serial-parallel-serial shift register is characterized by a serial input channel and a serial output channel interconnected by a plurality of parallel channels formed in a semiconductor body. Separate arrays of multi electrode sets of phase electrodes overlay the input, parallel and output channels. A summing gate electrode common to all of the parallel channels is then actuated to transfer charge packets into the output channel. The charge packets may then be clocked to the output of the CCD.

In one aspect, primary sets of electrodes are separated by isolation electrodes to reduce interchannel cross talk.

In another aspect, a dual S-P-S CCD is employed to assure operation in a frequency range when the CTE is high thereby to avoid signal degradation.

For a more complete understanding of the invention and for further objects and advantages thereof, reference may now be had to the following description taken in conjunction with the accompanying drawings in which.

Figure 1:
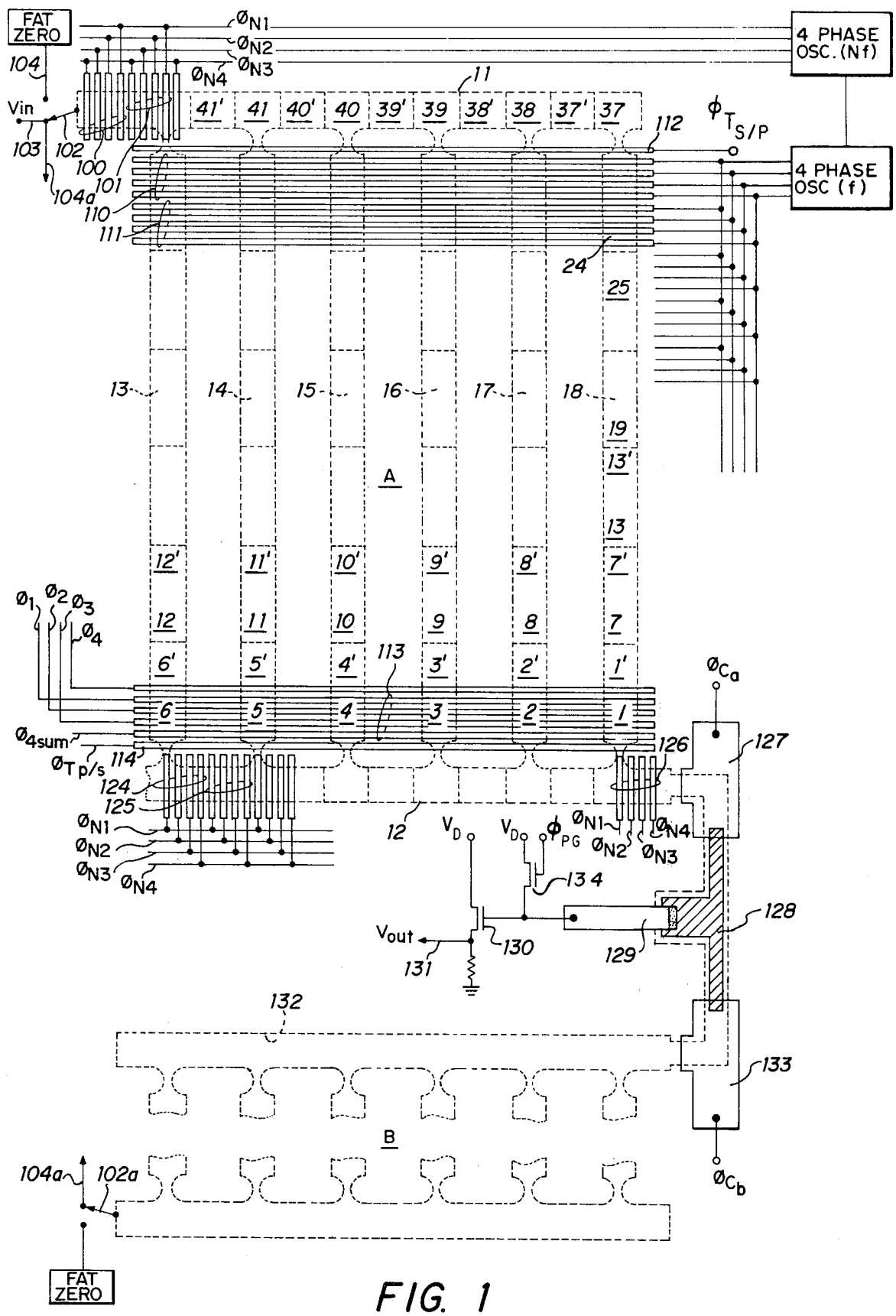
FIG. 1 is a block diagram of an S-P-S, CCD unit.

In FIG. 1 an S-P-S CCD A involves a serial input register 11, a serial output register 12 interconnected by a plurality of parallel registers 13–18. Serial registers 11 and 12 are six element registers as are each of parallel registers 13–18.

structurally, a CCD may comprise either an n-type or p-type silicon substrate, an MOS-type silicon dioxide insulation layer and an array of metallized electrodes over the insulation layer. In operation, a CCD with a p-type silicon substrate has a first threshold voltage of around $-1$ to $-2$ volts applied to the substrate so that a uniform depletion layer forms beneath all electrodes. In a storage mode, a more positive voltage of around 10 volts is applied to an individual electrode creating a deeper depletion layer beneath it thereby spatially defining a potential well. Such a device can receive and store charges. A charge may be injected into the substrate by an input p-n junction. Carriers in p-type silicon are electrons, and since the electrode is positive with respect to the substrate, the electrons are attracted towards the electrode and held in the potential well beneath it. In a transfer mode, the stored charge is shifted along a register by application of a positive voltage greater than 10 volts to an electrode adjacent the electrode on which the 10 volt level is applied. This establishes a well of even greater potential which attracts to it the electrons stored under the first electrode. The voltages are now returned to an initial condition except the electrons have moved one electrode location.

Three-phase CCD structures and four-phase CCD structures have been heretofore implemented and their operation in general is well understood.

The present invention will be described in terms of a four-phase S-P-S CCD. In CCD systems, low CTE gives rise to dispersion of the charge packet when shifted to the output of register 12. Such dispersion appears as cross talk between adjacent charge packets entered at the input to register 11.

In the parallel shift registers 13–18, the effect of low CTE is slightly different. The portion of the charge that is left behind in the parallel registers does not appear in an adjacent charge packet (adjacent in the sense of the input data) but rather in a charge packet that was entered into the CCD N-elements later. For example, in FIG. 1 the CCD is a 6 × 6 element CCD. In such structure, the charge packet of signal sample No. 7 (N=1) will receive the portion of the charge left behind by signal sample No. 1.

Both of above CTE effects will affect the performance of an S-P-S analog memory. Depending on the application, these effects can seriously degrade system performance.

Figure 2:
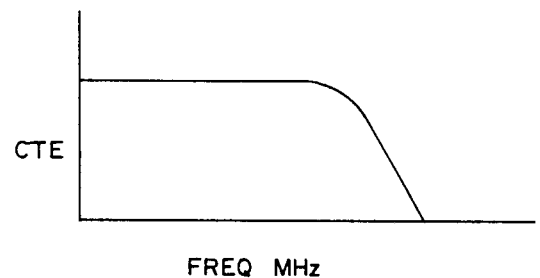
FIG. 2 is a typical relationship between charge transfer efficiency and frequency of operation.

FIG. 2 illustrates a typical relationship between CTE and frequency of operation. CTE decreases rapidly at frequencies above 8 to 10 megahertz in many CCD's. Yet many display systems require effective operation above that frequency.

An S-P-S analog memory typically may be used to store the output from a detector and at a later time the stored analog information forms one horizontal line on a CRT display. The CTE effects of the S-P-S cause reduced performance when displayed on the CRT and are referred to as (1) ghosting and (2) smearing.

The ghost effect is caused by the parallel portion of the S-P-S while the smear effect is produced by the serial portion. A great reduction in ghosting and smearing is achieved as by the present invention.

As to ghosting, incomplete charge transfer of a charge packet in the parallel portion 13–18 (FIG. 1) of an S-P-S analog memory will cause ghosting.

Elimination of ghosting problems is accomplished by adding a set of isolation electrodes to each set of primary electrodes.

In FIG. 1, for example, the serial channel 11 has electrodes connected to lines $\phi_{n1}$, $\phi_{n2}$, $\phi_{n3}$ and $\phi_{n4}$. The system is thus a four phase device. An electrode set 100 forms an isolation set of four electrodes adjacent to the input of the channel 11. Set 101 is a primary set. The channel 11 is alternately connected by way of a gate 102 to the input signal line 103 and to line 104. Channel 11 when connected to line 104 is given an excess negative charge generally known in the art as a fat zero.

The last electrode in set 101 overlies the throat leading to channel 13. Additional sets of isolation electrodes and primary electrodes extend the length of the channel 11 so that charge packets may be shifted serially through channel 11 and are thus available to be transferred from channel 11 into channels 13–18.

A set of electrodes 110 spans the parallel channels 13–18 forming an isolation set and electrodes 111 form a primary set of electrodes. Additional sets of electrodes, like electrodes 110 and 111, extend the length of the channels 13–18 and are connected to lines $\phi_1$–$\phi_4$. The lines $\phi_1$–$\phi_4$ operate at a submultiple of the frequency of the lines $\phi_{n1}$–$\phi_{n4}$. Electrode 112 serves as a transfer electrode to clock charge packets from the series channel 11 to the parallel channels on clock $\phi_{Ts/p}$. By this means, the charge packets are then transferred into and thence along the length of channels 13–18. The last set of four electrodes 113 are connected to lines $\phi_1$, $\phi_2$, $\phi_3$, and $\phi_{4sum}$. The last electrode 114, $\phi_{Tp/s}$, is a transfer electrode to shift the charges from the parallel sections 13–18 to the serial section 12.

A set of electrodes 124 span the output channel 12 adjacent to a set of primary electrodes 125. Charge packets in the lower stages of channels 13–18 are thus clocked into the channel 12. The last set of four electrodes 126 on channel 12 comprises electrodes connected to lines $\phi_{n1}$, $\phi_{n2}$, $\phi_{n3}$ and $\phi_{n4}$. Charge packets under the last electrode in set 126 are transferred under electrode 127 by means of a voltage $\phi_{C_a}$ and thence to an output structure 128. An output diode 129 is then connected to deliver charge by way of an output stage comprising FET 130 to an output line 131, the diode being precharged by MOS precharge transistor 133 gated by $\phi_{PG}$ immediately prior to $\phi_{C_a}$ and $\phi_{C_b}$.

In the form illustrated in FIG. 1, the structure thus far described comprises one-half of a dual unit in which the second half comprises an identical structure with the output series channel 132 being connected by way of an output electrode 133 to the output diode 129. Electrode 133 is a clocked by way of a voltage $\phi_{C_b}$.

In operation, when the parallel portion 13–18 is fully loaded, sample element 1 and its isolation element 1 are located in the first and second rows from the output providing for an isolation charge packet to exist between rows that have primary signal charge packets, i.e., as isolation elements 1', 2' . . . 6'.

Figure 3:
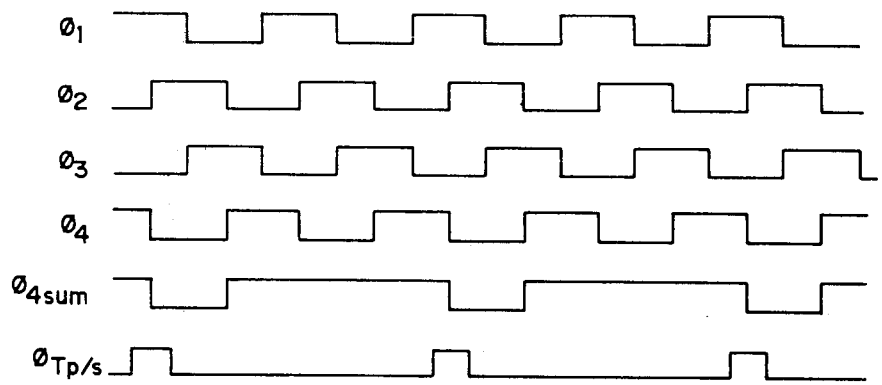
FIG. 3 illustrates timing diagrams for summing primary and isolation charge packets.

Preferably the primary and isolation charge packets are summed before they are shifted to the output shift register 12. This operation shown in FIG. 1 is for a four phase device. The phase voltage waveforms for the parallel shift register are shown in FIG. 3 and correspond with the legends in FIG. 1. The $\phi_{4sum}$ electrode of set 113 is the electrode positioned adjacent to the transfer $\phi_{Tp/s}$ electrode 114 between the parallel register 13–18 and output serial register 12. The waveforms including the voltage $\phi_{4sum}$ are shown in FIG. 3. The $\phi_{4sum}$ voltage is held on for two clock periods, that is, $\phi_{4sum}$ is high while $\phi_4$ is high and while $\phi_4$ is turned on and off twice. This allows the primary and isolation charge packets to be summed under the $\phi_{4sum}$ electrode. $\phi_{4sum}$ electrode preferably will have a larger area in order to allow for the summing of the primary charge packet and the isolation charge packet which has a "fat zero" level.

The fat zero level in the isolation elements is entered between the primary charge packets. Either of two techniques can be used. The first is to allow the fat zero to be entered at each of the input serial registers after the parallel transfer and before the next data is entered into the shift register. The second technique is shown in FIG. 1 where an isolation element is adjacent to each primary element and the charge for the isolation elements is entered through gate 102 from line 104.

For the same output rates, both the input serial and parallel shift register have to run at twice the frequency at which they would operate if there were no isolation elements. As previously mentioned, the CTE effects in the output shift register produces smearing. Smearing is virtually eliminated by using the isolation elements illustrated in FIG. 1. In systems where the system is to be compatible with systems such as a standard television display, the unit of FIG. 1 rather than being a 6 × 6 parallel section would be of the order of a 30 × 30 array. The output data rate would be high (=17.3 MHz). In use of isolation elements in the output serial register, the phase clock frequency would be =34.6 MHz.

Figure 4:
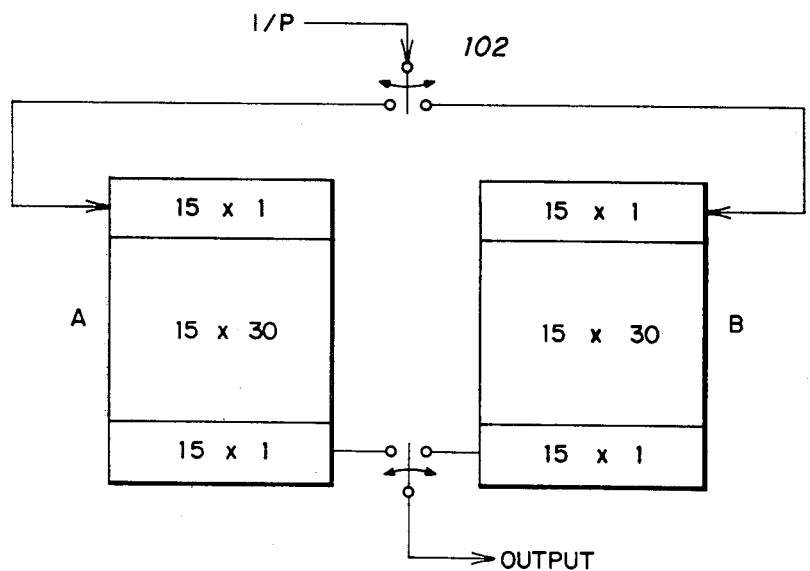
FIG. 4 illustrates the overall arrangement in which CCD units A and B receive alternate input signal samples.

In order to avoid such high frequency operation, a dual isolation element S-P-S CCD is used wherein the companion unit having output channel 132 is employed. FIG. 4 illustrates the overall arrangement in which CCD units A and B receiver alternate input signal samples by way of switch 102. The signal samples then pass through the two S-P-S CCD's A and B and are recombined or multiplexed at the output.

In order to be able to commutate the output serial register from units A and B, the primary and isolation charge packets are summed as discussed in connection with operation of electrode $\phi_{4sum}$. The waveforms for the output serial registers are indicated in FIG. 5.

It will be noted that from FIG. 3 the clock pulses $\phi_1$, $\phi_2$, $\phi_3$ and $\phi_4$ are pulses of 180° duration and overlap the preceding and succeeding pulses by 90°. The pulse $\phi_{4sum}$ is of length to encompass one and one-half of the periods of the waveform $\phi_4$. By this means, the contents of the primary cell and the isolation cell, such as cells 1 and 1', FIG. 1, are added for application to output register 12.

Figure 5:
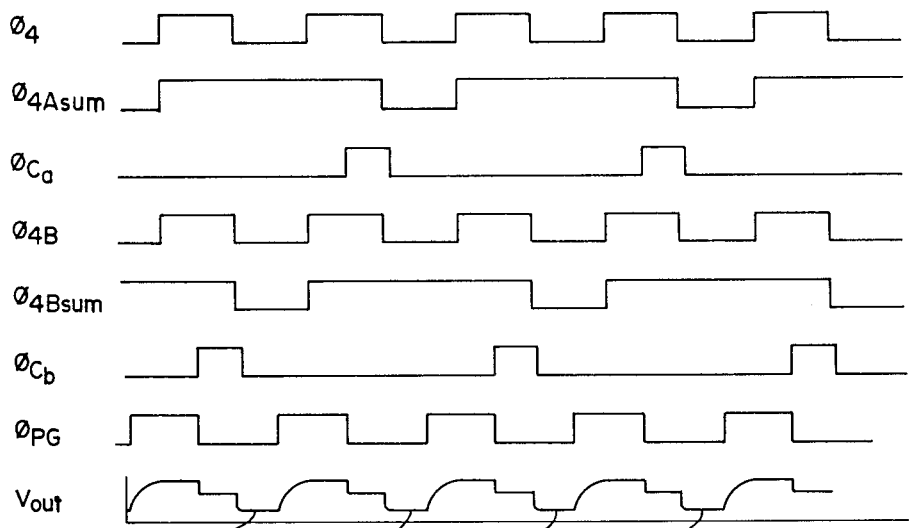
FIG. 5 illustrates the waveforms of the serial outputs of the dual S-P-S structure.

In FIG. 5, the operation of the two units A and B is indicated. The pulses $\phi_{N4Asum}$ and $\phi_{N4Bsum}$ bear the same relationship to the waveforms $\phi_{N4A}$ and $\phi_{N4B}$ as $\phi_{4sum}$ does to $\phi_4$ FIG. 3. The waveforms $\phi_{ca}$ and $\phi_{cb}$ clock the charges out of the series units 12 and 132 to the output diode 129. The output voltage $V_{out}$ appearing on line 131 then has the appearance indicated in FIG. 5.

In using CCD's to be compatible with standard television signal rates of about 17.3 MHz, the output serial registers 12 operate at this 17.3 MHz frequency rate. In a four-phase structure as many as $30 \times 4 = 120$ transfers of a charge packet must be made at the 17.3 MHz frequency rate. However, many CCD structures at best have a CTE frequency response that has a break frequency of 8–10 MHz as shown in FIG. 2. Hence a lower value of CTE occurs at 17.3 MHz rate than at 8 MHz.

The dual S-P-S of FIG. 1 may be a $30 \times 30$ element device divided into two $15 \times 30$ element structures with the output multiplexer between the two structures.

The input signal is demultiplexed into the two $15 \times 1$ arrays by switches 102 and 102a of FIG. 1. The stored information is then shifted down to the correct $15 \times 30$ arrays. Upon readout, the stored charge packets are shifted into the output shift registers 12 and 132 and shifted to the end of each register. The output from each register is then multiplexed to form a single channel output.

Figure 6:
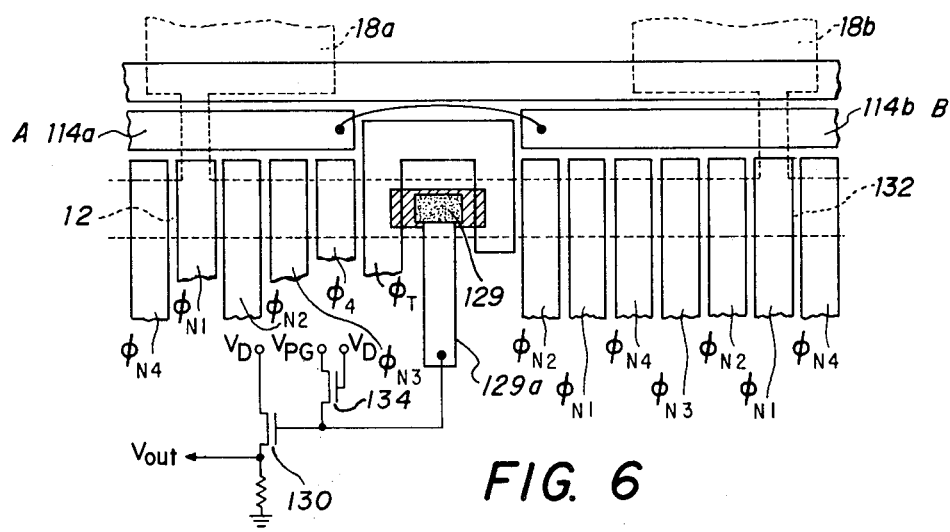
FIG. 6 illustrates the structure ensuring arrival of the charge packets at the output 180 electrical degrees apart.
Figure 7:
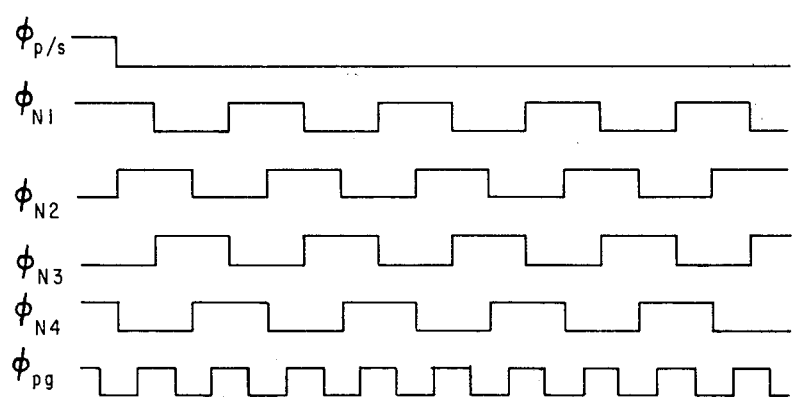
FIG. 7 illustrates output register waveforms of the dual S-P-S structure without the sets of isolation electrodes.

The charge packets forming the two trains arrive at the output diode 129, 180 electrical degrees apart from each of the two registers. Structure used to assure arrival of the packets at the output 180 electrical degrees apart preferably employs two extra electrodes on one of the output shift registers as shown in FIG. 6. For the case where isolation elements are not employed, FIG. 7 illustrates output register waveforms. In FIG. 6 the two output channels 12 and 132 underly output diode 129. Channel 12 underlies electrodes $\phi_{N4}$, $\phi_{N1}$, $\phi_{N2}$, $\phi_{N3}$ and $\phi_{N4}$ in the same array as in FIG. 1. Electrode $\phi_{N1}$ overlays the inlet leading from the last parallel channel 18. Added is transfer electrode $\phi_T$ which is shaped to overlay both channels 12 and 132 allows the transferring of the packets from the parallel registers to the output serial registers.

Transfer electrodes 114a and 114b (FIG. 6) serve to clock charge packets from the parallel channels into the series output channel 12–132. Channel 132 underlies electrodes including (from the right side) $\phi_{N4}$, $\phi_{N1}$, $\phi_{N2}$, $\phi_{N3}$ and $\phi_{N4}$ as was the case with channel 12. Electrode $\phi_{N1}$ overlays the inlet leading from the last parallel channel 18b in unit B.

Two additional electrodes $\phi_{N1}$ and $\phi_{N2}$ are positioned between the left $\phi_{N4}$ electrode of unit B and an extension of the transfer electrode $\phi_T$ as shown in FIG. 6.

The operation is as follows: Charge packets in the parallel shift registers of units A and B are shifted down into the two output shift registers 12 and 132 at the same time. The parallel transfer gate electrode 114a, b is gated by $\phi_{TP/S}$ and is common to both of the arrays A and B. The packets are thus positioned in the output shift registers under $\phi_{N1}$ electrodes. The packets are then clocked by the phase electrodes voltage waveforms $\phi_{N1}$, $\phi_{N2}$, $\phi_{N3}$ and $\phi_{N4}$ to the output diode 129. As shown the charge packet in the A unit in the left hand side shift register arrives at the output diode when in an n-channel device $\phi_{N4}$ goes to zero. However, the charge packet from the B unit in the right-hand side electrode does not arrive until the next $\phi_{N2}$ voltage waveform drops to zero. Hence the respective charge packets arrive at the output diode 180 electrical degrees apart and the shift registers 12 and 132 are effectively multiplexed allowing them to run at one-half of the output data rate. The output diode 129 is precharged by the precharge MOS device 134 prior to the arrival of each charge packet. The voltage waveform $\phi_{PG}$ applied to the precharge gate electrode of the MOS transistor 134 is pulsed at the output data rate.

This not only allows the output shift register to operate at one-half the output clock rate, but decreases the maximum number of transfers by one-half in comparison to a single S-P-S CCD of the same output rate.

Where compatability with standard television is an object, the dual multiplexed CCD system shown in FIGS. 1, 4 and 6 may be employed without the isolation electrode arrays so long as the data rate is maintained below the 8–10 megahertz level. High CTE characterizing the lowered data rates permits the elimination of the isolation electrodes.

Thus, the invention involves an S-P-S CCD with isolation electrodes as shown by unit A or unit B of FIG. 1. It involves dual S-P-S CCD's with isolation electrodes as shown in FIG. 1.

It involves dual S-P-S CCD's wherein the system of FIG. 1, the isolation electrode set are eliminated.

Having described the invention in connection with certain specific embodiments thereof, it is to be understood that further modifications may now suggest themselves to those skilled in the art and it is intended to cover such modifications as fall within the scope of the appended claims.

What is claimed is:

1. Charge transfer device signal processing apparatus for handling time sampled analog input signals, comprising:
    first and second charge transfer device shift registers each including:
        a. a serial input channel and a serial output channel connected to said input channel by a plurality of parallel channels wherein all said channels are formed in a semiconductor body,
        b. separate arrays of multi electrode sets of phase electrodes insulated from and overlying said input, parallel and output channels,
        c. an output transfer electrode common to all of the parallel channels of that shift register;
    means for inputting time samples of said input signals alternately to the input channels of each of said first and second shift registers; and
    said serial output channels of the first and second shift registers including means operable to multiplex outputs from said output channels.

2. Apparatus as set forth in claim 1, wherein the output transfer electrodes of said first and second shift registers are electrically common to all of said parallel channels of both shift registers for simultaneous shift of charge packets to both said output channels; and including output means common to the output channels of both of said first and second shift registers to multiplex said charge packets for flow in the same order as said time samples of said input signals.

3. Apparatus as set forth in claim 1 in which the output channels for said first and second shift registers are unified and in which one output signal extraction means is provided for extracting charge packets therefrom.

4. Apparatus according to claim 3, in which means including a transfer electrode electrically common to all said parallel channels of both said first and second shift registers is operable to clock charge packets into said output channels and in which electrodes on the output of one of said first and second shift registers differ from the electrodes on the output channel of the other of said first and second shift registers as to introduce a differential in the propagation times at the outputs of said two shift registers for permitting multiplexing of the charge packets reaching said signal extraction means.

5. Apparatus as set forth in claim 1, in which multiphase voltage pulses are applied to said electrodes to transfer said charge packets.

6. Apparatus as set forth in claim 5, in which the rate of said pulses applied to electrodes over said serial channels is high compared to the rate of pulses applied to said parallel channels.

7. Apparatus as set forth in claim 1 in which the electrode arrays overlying said parallel channels comprise electrodes each of which is common to all said parallel channels of both of said first and second shift registers.

8. Charge transfer device signal processing apparatus comprising:
    first and second input charge coupled device serial shift registers;
    means for inputting samples of analog input signals alternately into said first and second shift registers for propagation along said shift registers;
    third and fourth serial output charge coupled device shift registers;
    a plurality of serial charge coupled device shift registers having input ends aligned with respective bits of said first and second shift registers and having output ends aligned with respective bits of said third and fourth shift registers;
    transfer electrode means electrically common to all of said parallel shift registers for simultaneous transfer of charge packets from said parallel shift registers into said third and fourth shift registers for propagation along said third and fourth shift registers;
    signal extraction means common to said third and fourth shift registers and located adjacent the output ends thereof;
    said third and fourth shift registers being adapted for operation to transfer charge packets alternately to said signal extraction means.

9. Apparatus as set forth in claim 8, wherein said first and second shift registers each has m bits;
    means for propagating charge packets along said first and second shift registers at a frequency $f_1$; and
    means for operating said parallel shift registers to propagate charge packets at a frequency of about $f_1/m$.

10. Apparatus as set forth in claim 9, further including means for operating said third and fourth shift registers to propagate charge packets therealong at a frequency of about $f_1/2$.

11. Apparatus as set forth in claim 8, wherein all of said shift registers are four-phase shift registers, and wherein one of said third and fourth shift registers includes two phase electrodes more than the other one of said third and fourth shift registers.

12. Apparatus as set forth in claim 11, wherein all said shift registers are formed on a common semiconductor body.

13. Apparatus as set forth in claim 12, wherein all of said shift registers are surface channel registers.

14. Apparatus as set forth in claim 12, wherein said output signal extraction means comprises a diode formed in said semiconductor body, said diode being connected to the input of an output transistor.

* * * * *